United States Patent
Yu et al.

(10) Patent No.: US 8,664,027 B2
(45) Date of Patent: Mar. 4, 2014

(54) LED MESA SIDEWALL ISOLATION BY ION IMPLANTATION

(75) Inventors: San Yu, Perrysburg, OH (US); Atul Gupta, Beverly, MA (US)

(73) Assignee: Varian Semiconductor Associates, Inc., Gloucester, MA (US)

( * ) Notice: Subject to any disclaimer, the term of this patent is extended or adjusted under 35 U.S.C. 154(b) by 0 days.

(21) Appl. No.: 13/364,476

(22) Filed: Feb. 2, 2012

(65) Prior Publication Data

US 2012/0238046 A1    Sep. 20, 2012

Related U.S. Application Data

(60) Provisional application No. 61/441,851, filed on Feb. 11, 2011.

(51) Int. Cl.
*H01L 21/00* (2006.01)

(52) U.S. Cl.
USPC ............... 438/45; 438/22; 438/46; 257/79; 257/88; 257/94; 257/98; 257/E21.112

(58) Field of Classification Search
None
See application file for complete search history.

(56) References Cited

U.S. PATENT DOCUMENTS

| | | | |
|---|---|---|---|
| 4,675,978 A * | 6/1987 | Swartz | 438/151 |
| 5,106,768 A * | 4/1992 | Kuo | 438/229 |
| 5,672,541 A * | 9/1997 | Booske et al. | 438/513 |
| 6,337,260 B1 | 1/2002 | Ishida | |
| RE39,988 E | 1/2008 | Wickboldt et al. | |
| 7,338,822 B2 | 3/2008 | Wu et al. | |
| 7,943,406 B2 | 5/2011 | Slater, Jr. et al. | |
| 2005/0194584 A1 | 9/2005 | Slater, Jr. et al. | |
| 2006/0011946 A1* | 1/2006 | Toda et al. | 257/202 |
| 2006/0071210 A1* | 4/2006 | Yamazaki et al. | 257/57 |
| 2007/0087574 A1 | 4/2007 | Gupta et al. | |
| 2008/0205465 A1 | 8/2008 | Nguyen et al. | |
| 2008/0237629 A1 | 10/2008 | Ando et al. | |
| 2009/0227096 A1 | 9/2009 | Godet et al. | |
| 2010/0193866 A1 | 8/2010 | Mulfinger et al. | |
| 2010/0273322 A1 | 10/2010 | Papasouliotis et al. | |
| 2011/0263054 A1 | 10/2011 | Yu et al. | |
| 2012/0032212 A1 | 2/2012 | Huang et al. | |

* cited by examiner

*Primary Examiner* — Kyoung Lee

(57) ABSTRACT

A method of LED manufacturing is disclosed. A coating is applied to a mesa. This coating may have different thicknesses on the sidewalls of the mesa compared to the top of the mesa. Ion implantation into the mesa will form implanted regions in the sidewalls in one embodiment. These implanted regions may be used for LED isolation or passivation.

20 Claims, 5 Drawing Sheets

LED MESA SIDEWALL ISOLATION BY ION IMPLANTATION

CROSS-REFERENCE TO RELATED APPLICATIONS

This claims priority to the provisional patent application entitled "LED Mesa Sidewall Isolation by Ion Implantation," filed Feb. 11, 2011 and assigned U.S. App. No. 61/441,851, the disclosure of which is hereby incorporated by reference.

FIELD

This invention relates to fabrication of light emitting diodes (LEDs) and, more particularly, to isolation of LED sidewalls.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

LEDs are built on a substrate and are doped with impurities to create a p-n junction. A current flows from the p-side, or anode, to the n-side, or cathode, but not in the reverse direction. Electrons and holes flow into the p-n junction from electrodes with different voltages. If an electron meets a hole, it falls into a lower energy level and releases energy in the form of a photon. The wavelength of the light emitted by the LED and the color of the light may depend on the band gap energy of the materials forming the p-n junction.

The LED mesa is isolated or passivated in some instances. This may involve a coating to prevent current leakage or shorting on the sidewall of the mesa. Some methods involve a photolithographic patterning step prior to adding a dielectric thin film, but such methods involve extra process steps, complexity, and cost. Accordingly, there is a need in the art for improved methods of isolation in LEDs.

SUMMARY

According to a first aspect of the invention, a method of ion implantation is provided. The method comprises implanting ions into a portion of a structure through a coating on the structure. The structure defines a first surface and a plurality of second surfaces adjacent to the first surface. The ions penetrate the coating to a second depth in the second surfaces different from a first depth in the first surfaces.

According to a second aspect of the invention, a method of LED manufacturing is provided. The method comprises depositing a coating on a structure that defines a first surface and a plurality of second surfaces that are at an angle relative to the first surface. A first implantation of ions through the coating is performed. Implanted regions are formed only within the second surfaces.

According to a third aspect of the invention, a method of LED manufacturing is provided. The method comprises depositing a coating on a mesa defining a top surface and at least two sidewall surfaces. The mesa has an nGaN layer, a pGaN layer, and a quantum well. The coating defines a first thickness on the top surface and a second thickness on the sidewall surfaces. The second thickness is less than the first thickness. Ions are implanted through the coating into the mesa in at least one ion implantation step. The implantation is at an angle that is not perpendicular to the top surface. Implanted regions are formed only within the sidewall surfaces of the mesa. The coating is removed from the mesa.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments are described herein in connection with ion implantation of LEDs, but these embodiments also may be used with other semiconductor or workpiece manufacturing processes. A beam-line ion implanter, plasma doping ion implanter, plasma tool that modifies a plasma sheath, an implanter that creates a focused ion beam, or other ion implantation systems known to those skilled in the art may be used for the embodiments described herein. Furthermore, the embodiments described herein may apply to many different LED architectures known to those skilled in the art different from those disclosed. Thus, the invention is not limited to the specific embodiments described below.

Embodiments herein use ion implant to passivate or isolate the LED mesa sidewalls without using a photolithographic process. This will reduce the cost and manufacturing time compared to existing processes by avoiding process steps typically used to expose the mesa sidewalls while protecting the top surface of the LED from the ion beam. Some processes typically include spinning, baking, exposing, and developing photoresist. The steps may also include depositing a dielectric coating or a metal, and subsequently etching the coating or the metal from the sidewall after protecting it using photoresist. Each of these additional steps adds cost and cycle time to the LED manufacturing process, which is undesirable. Isolation or passivation will protect the LED from unexpected current leakage or control the effective current passing through an active region of the LED. Leakage currents are detrimental to the LED performance because the electrical carriers flowing through these leakage paths do not contribute to the generation of useful light in the active region of the device. Leakage current also may short to adjacent LED devices or parts during packaging, which may cause degradation of device reliability or, in extreme cases, device failure.

Figure 1:
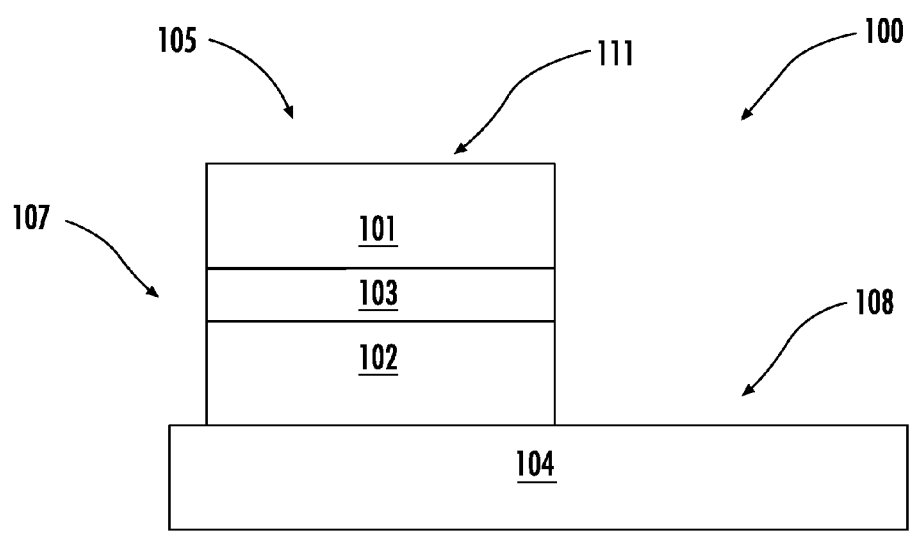
FIG. 1 is a cross-sectional side view of LED structure.

FIG. 1 is a cross-sectional side view of LED structure. The LED 100 includes a pGaN layer 101, nGaN layer 102, quantum well 103, and substrate 104. The quantum well 103 in one instance is a multiple quantum well (MQW) or an MQW stack. The pGaN layer 101 and nGaN layer 102 may be grown using metal organic chemical vapor deposition (MOCVD) in one instance. While the sidewall 107 of the mesa 105 is shown perpendicular to the surface 108 of the substrate 104 and the top 111 of the mesa 105, the sidewalls 107 may be angled with respect to the substrate 104 in some instances. For example, the sidewalls 107 may be at an approximately 60° to 80° angle relative to the substrate 104 or top 111. Thus, the mesa 105 may be polygonal in shape rather than square or rectangular. The rectangular mesa 105 is merely illustrative. While only two sidewalls 107 are illustrated in FIG. 1 because it is a cross-sectional view, the mesa 105 may have four or more sidewalls 107. The sidewalls 107 also may be referred to as second surfaces and the top 111 may be referred to as a first surface.

Figure 2:
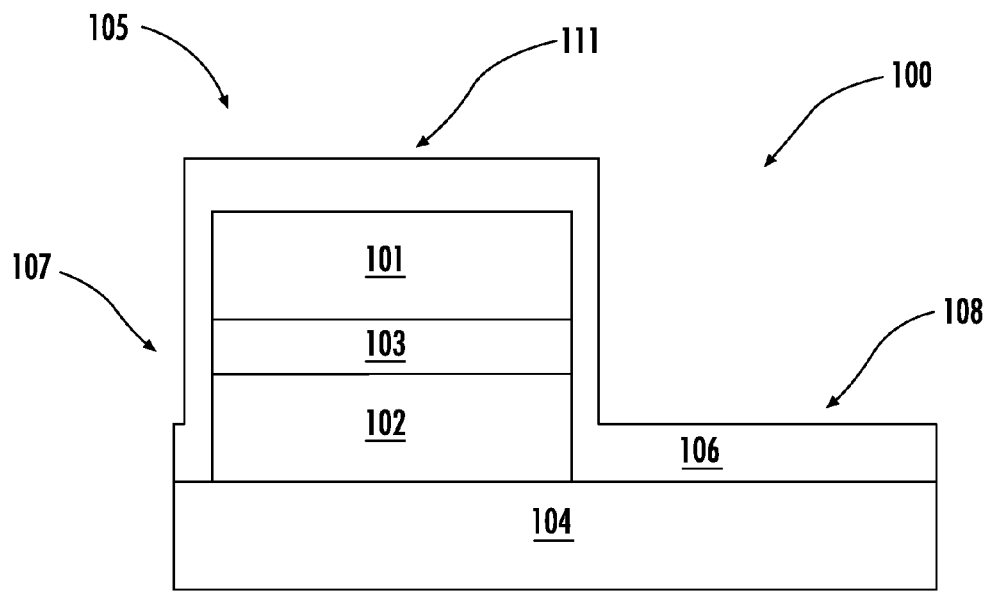
FIG. 2 is a cross-sectional side view of a first step in an LED manufacturing process.

FIG. 2 is a cross-sectional side view of a first step in an LED manufacturing process. A coating 106 is applied to the LED 100. This coating 106 may be a sheet dielectric or other hard masking material. For example, silicon dioxide, silicon nitride, a metal, a polymer, some other organic compound, or other materials known to those skilled in the art may be used. Photoresist may be one example of a polymer used as the coating 106. Chemical vapor deposition (CVD), MOCVD, physical vapor deposition (PVD), electron beam or thermal evaporation, atomic layer epitaxy, other epitaxy processes, paste processes, spray processes, spin coating processes, or other methods known to those skilled in the art may be used to apply the coating 106.

The coating 106 may be thinner on the sidewalls 107 of the mesa 105 than the surface 108 of the substrate 104, which may include a trench bottom, or the top 111 of the mesa 105. Thus, a first thickness is disposed on the top 111 and surface 108 and a second thickness is disposed on the sidewalls 107. This second thickness is smaller than the first thickness. The difference in coating 106 thicknesses may be caused by, for example, differences in angles of deposition or application relative to the substrate 104. For example, if the direction of deposition or application of the coating 106 is perpendicular to the top 111 of the mesa 105, then the sidewalls 107 may be exposed to less of the material that is deposited to form the coating 106.

The thickness differences of the coating 106 on the sidewalls 107 and other surfaces 108 may be enhanced by process parameters. The thickness is difference on the various surfaces of the LED 100 may be between approximately 2× and 4× in one instance, but other differences or measurements are possible. The coating 106 may be applied across all or part of the substrate 104.

Figure 3:
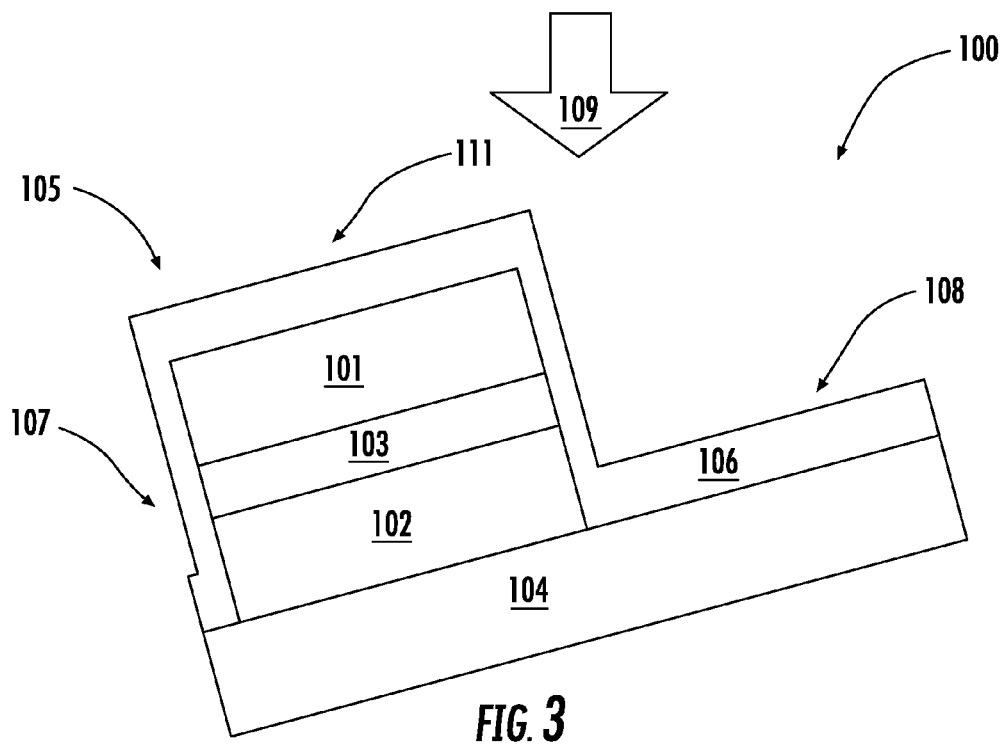
FIG. 3 is a cross-sectional side view of a second step in an LED manufacturing process.

FIG. 3 is a cross-sectional side view of a second step in an LED manufacturing process. The LED 100 is tilted with respect to the ions 109 that are implanted. Thus, the ions 109 are implanted at an angle with respect to the top 111 of the mesa 105 that is not perpendicular to the top 111 of the mesa 105. This tilted implant of the LED 100 enables the sidewalls 107 to be implanted. An implant perpendicular to the top 111 of the mesa 105 would reduce or prevent ions 109 from implanting the sidewalls 107 of the mesa 105. The ions 109 may be, for example, at least one of nitrogen, hydrogen, helium, argon, oxygen, magnesium, boron, carbon, iron, phosphorus, germanium, silicon, aluminum, fluorine, zinc, other noble gases, other dopants, or other species known to those skilled in the art. Larger ions 109, such as zinc, may create more damage per unit dose, but smaller ions 109 also may be used depending on the ion beam parameters. Other ions 109, such as fluorine, may increase the bandgap of the compound semiconductor or have some other chemical effect. In one instance, the LED 100 may be tilted 60° with respect to the ions 109, but other angles are possible. This may involve tilting a platen holding the LED 100, varying the implant angle of the ions 109, or both.

The ions 109 penetrate through the coating 106 on the sidewalls 107 of the mesa 105. If there is a thickness difference in the coating 106 between the sidewalls 107 and surfaces 108 or top 111, then the mesa 105 or LED 100 may not be implanted through the coating 106 on the surfaces 108 or top 111 partly due to the angle of implantation relative to these surfaces and partly due to the thickness difference of the coating 106. The implant energy of the ions 109 also may be adjusted to obtain the desired implant depth.

In one particular embodiment, at least two implant steps are performed to implant all sides of the mesa 105. In another particular embodiment, four implant steps are performed. In yet another particular embodiment, only a single implant step is performed. These may use single or chained doses to form either a Gaussian profile or a box profile.

Figure 6:
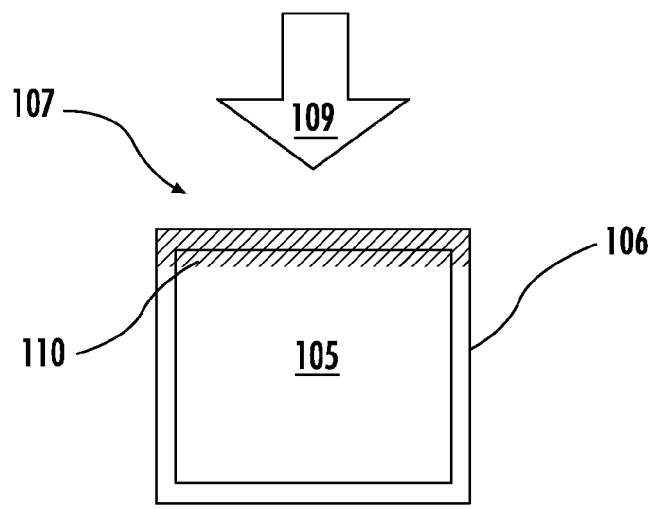
FIGS. 6 and 7 are top cross-sectional views of implantation into an LED mesa.
Figure 7:
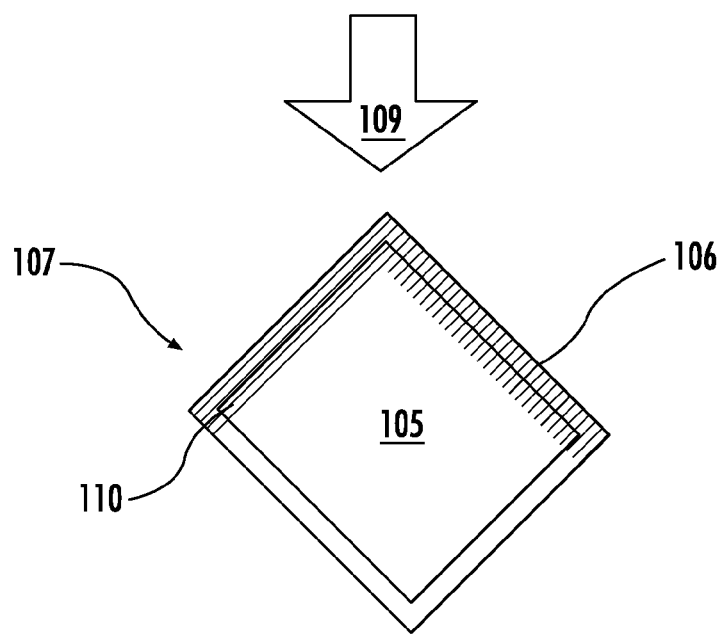

FIGS. 6 and 7 are top cross-sectional views of implantation into an LED mesa. In FIG. 6, the ions 109 are implanted into the sidewall 107 of the mesa 105 through the coating 106 to form an implanted region 110 (illustrated by the hash marks). This implanted region 110 is in one sidewall 107 because the ions 109 are implanted only into one sidewall 107 of the mesa 105. In contrast, FIG. 7 illustrates an embodiment where a single implant of ions 109 can form implanted regions 110 in two sidewalls 107 of the mesa 105. This is because the mesa 105 is orientated with respect to the ions 109 such that multiple sidewalls 107 are exposed to the ions 109. Using the embodiment of FIG. 7, two implants of ions 109 can be used to form implanted regions in four sidewalls 107 of the mesa. Of course, four implants of ions 109 may be used to implant all four sidewalls 107 using the embodiment illustrated in FIG. 6 or fewer than all the sidewalls 107 may be implanted with the ions 109.

Figure 4:
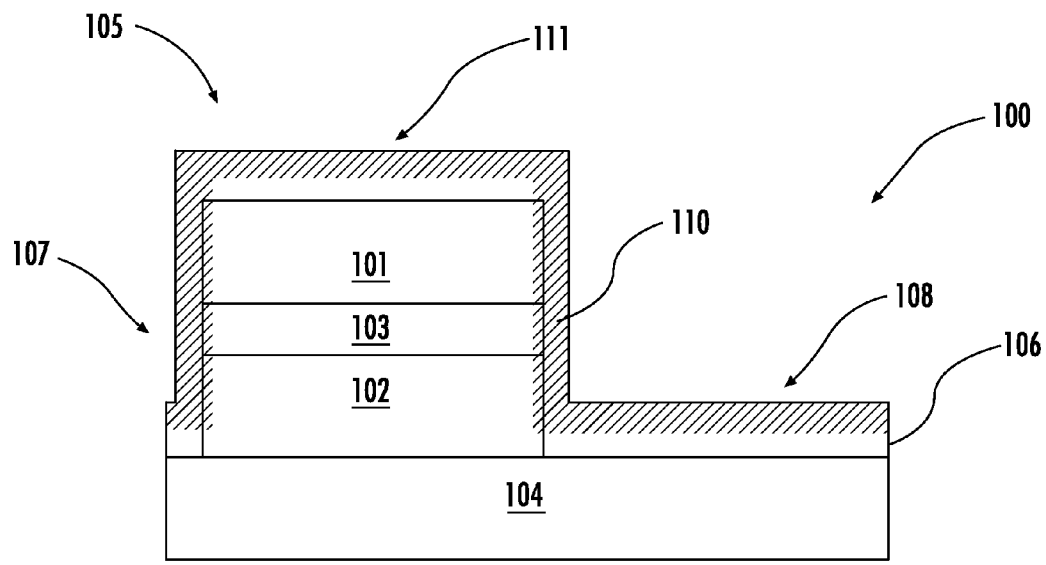
FIG. 4 is a cross-sectional side view of a third step in an LED manufacturing process.

FIG. 4 is a cross-sectional side view of a third step in an LED manufacturing process. The coating 106 and LED 100 have an implanted region 110 (illustrated by the hash marks). This implanted region 110 extends into the mesa 105 on the sidewalls 107, but only extends into the coating 106 on the other surfaces 108 or top 111. Thus, the penetration depth (Rp) is different into the sidewalls 107 compared to into the surface 108 or top 111. The dose and energy of the implanted ions, such as ions 109 in FIG. 3, may be configured to create the implanted region 110 in the sidewalls 107 of the mesa 105, but not the surface 108 or top 111 of the LED 100. In one instance, the implant energy is between approximately 1 eV to 100 MeV and the implant dose is between approximately 1E5 cm$^{-2}$ to 1E23 cm$^{-2}$.

The Rp is configured in one embodiment to extend to a particular depth into the coating 106. In locations where the thickness of the coating 106 is less than the Rp into the coating 106, then an implanted region 110 will be formed below or through the coating 106.

Figure 5:
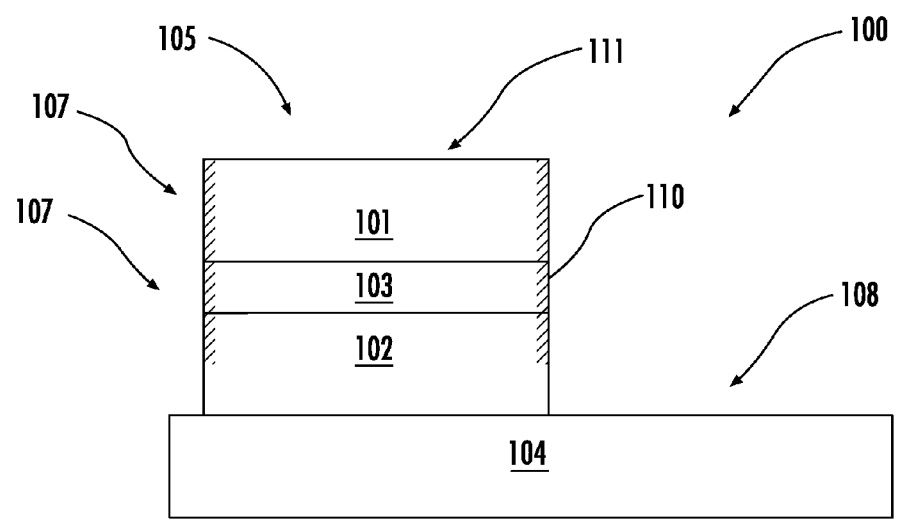
FIG. 5 is a cross-sectional side view of a fourth step in an LED manufacturing process.

FIG. 5 is a cross-sectional side view of a fourth step in an LED manufacturing process. The coating 106 is removed. In one embodiment, a chemical process is used to remove the coating. Implanted regions 110 are retained on or in the sidewalls 107 of the mesa 105. These implanted regions 110 can isolate or passivate the LED 100. In one embodiment, the implanted regions 110 have a depth between approximately 30 nm to 200 nm into the mesa 105. The use of the coating 106 may increase the longitudinal straggle of the ions in the sidewalls 107 depending on the ratio of thickness of the coating 106.

The implanted regions 110 may be in the entirety of the sidewalls 107 of the mesa 105. The implant angle may be configured to form such implanted regions 110. Yet in the embodiment of FIG. 5, the implanted regions are in the sidewalls 107 of the pGaN layer 101, the quantum well 103, and part of the nGaN layer 102. This may be partly due to the thickness of the coating on the surface 108 because it may block some of the ions that were implanted. It may be sufficient if only the sidewalls 107 of the pGaN layer 101 and quantum well 103 are fully isolated or passivated. Of course, other embodiments are possible.

While the implanted regions 110 also are illustrated in FIG. 5 in part of the top 111 (in a region equivalent to the depth of the implanted regions 110), this may not occur in one embodiment depending on the thickness of the coating 106 or angle of implant of the ions 109. Thus, only part of the pGaN layer 101 may be implanted in this embodiment. Even if part of the top 111 is implanted to form the implanted regions 110 in the sidewalls 107 as illustrated in FIG. 5, the implanted regions 110 are primarily formed in the sidewalls 107 and a majority or at least part of the top 111 is not implanted.

Figure 8:
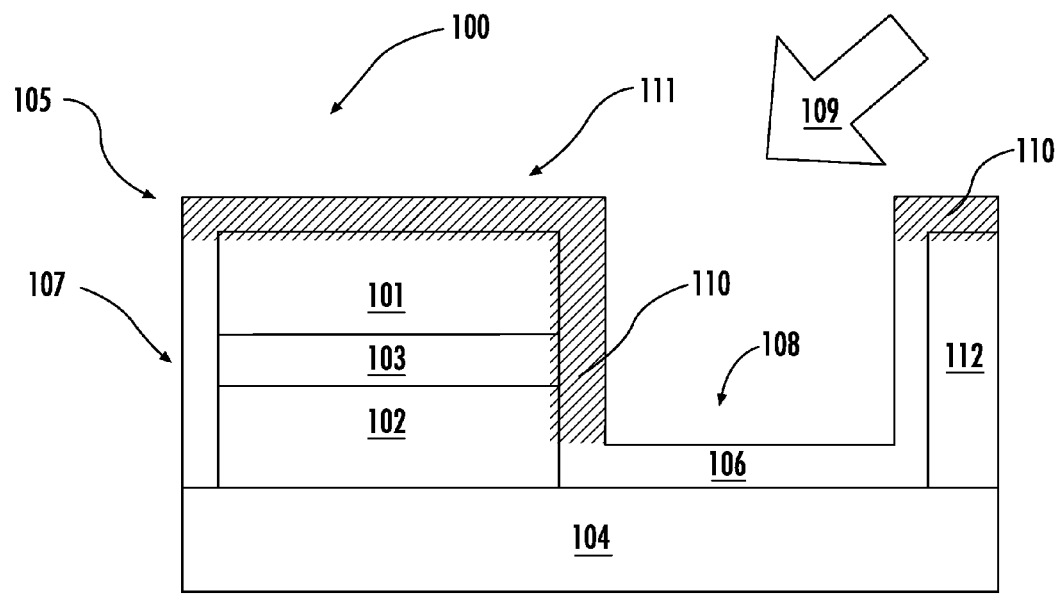
FIG. 8 is a cross-sectional side view of a second embodiment of implantation during an LED manufacturing process.

In another embodiment, the coating 106 has a uniform thickness on all surfaces. If the coating 106 has a uniform thickness, a similar effect may be obtained by changing the implant angle of the ions 109. This is illustrated in FIG. 8. The ions 109 are implanted at an energy sufficient to penetrate the coating 106. A neighboring mesa 112 may block or shadow the ions 109 from implanting the surface 108 of the substrate 104. The orientation of the ions 109 with respect to the mesa 105 also prevent: formation of an implanted region 110 (illustrated by the hash marks) from forming on all the sidewalls 107 of the mesa 105. Unless the implanted at an angle and energy configured to avoid implanting the top 111, the implanted region 110 may form in the top 111 of the mesa 105. This is because the coating 106 has a uniform thickness and there is no thickness variation to prevent ions 109 from penetrating through the coating 106. Multiple implants may be performed using the embodiment of FIG. 8 to implant all sides of the mesa 105. The implanted region 110 on the top 111 of the mesa 105 may be removed in one embodiment.

In an alternate embodiment of FIG. 8, the ions 109 are implanted at a steep angle with respect to the top 111 of the mesa 105. This reduces or avoids implantation into the top 111 even though the coating 106 has a uniform thickness. The energy of the ions 109 also is configured to reduce or avoid implantation into the top 111. This embodiment results in implantation primarily or only into the sidewalls 107 even though the coating 106 has a uniform thickness.

Figure 9:
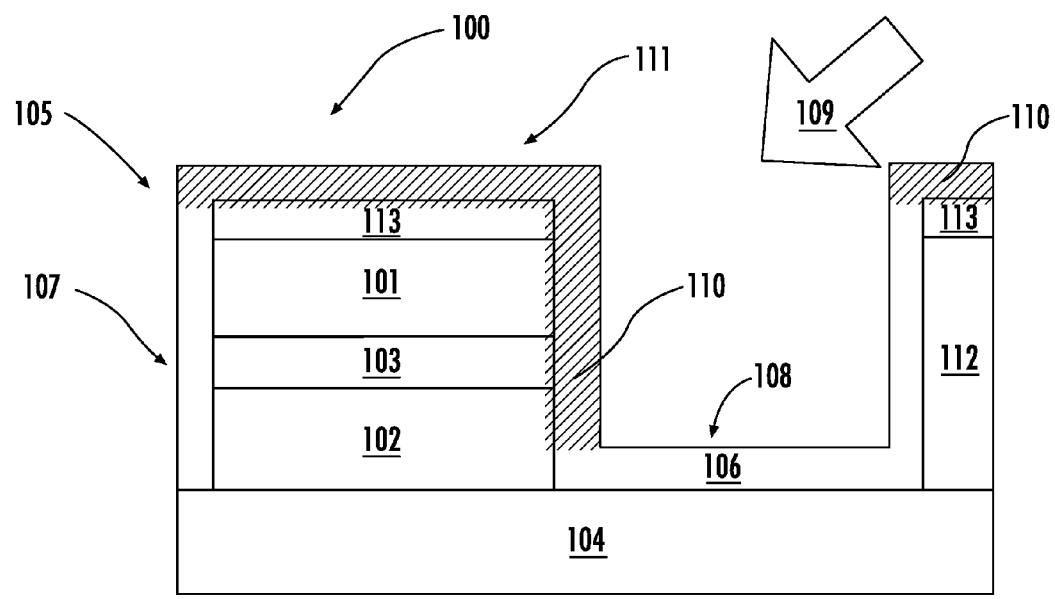
FIG. 9 is a cross-sectional side view of a third embodiment of implantation during an LED manufacturing process.

In yet another alternate embodiment illustrated in FIG. 9, a protective layer 113 exists on the top 111 of the mesa 105. The protective layer 113 also may be disposed on other surfaces of the LED 100. The protective layer 113 may be used for patterning the mesa 105 or forming trenches, for example. This protective layer 113 may further protect the mesa 105 from the ions 109 by supplementing the coating 106. It also may eliminate the need for a coating 106 with different thicknesses on different regions of the LED 100. If the coating 106 has a uniform thickness, this protective layer 113 may increase the total distance of the outer surface of the coating 106 and the top 111 of the mesa 105 such that the ions 109 are unable to penetrate into the top 111 and form an implanted region 110. Instead, the implanted region 110 is only formed in the coating 106 and protective layer 113 on the top 111 of the mesa 105. Of course, this protective layer 113 may be used with a coating 106 that has two different thicknesses. Multiple implants may be performed using the embodiment of FIG. 9 to implant all sides of the mesa 105.

In yet another alternate embodiment, the coating 106, which may have different thicknesses on different parts of the LED 100 or a uniform thickness on the LED 100, includes a dopant. The implanted ions 109 knock-in or drive-in some of this dopant into the LED 100 during the implant process. Thermal diffusion also may be used to drive-in some of this dopant from the coating 106 into the LED 100. This dopant may supplement the ions 109 in forming the implanted regions 110. The dopant in the coating 106 may be different than the species of ion 109. This may reduce the number of implant steps or implant species needed to form the implanted regions 110. In one instance, silicon or oxygen from a dielectric coating 106 may be driven into the LED 100 to form insulating traps in the LED 100. In another instance, carbon from an organic or polymer coating 106 may be driven into the LED 100 to form insulating regions in the LED 100.

The embodiments disclosed herein may be applied to any type of LED sidewall or surface isolation, including for vertical LEDs, lateral LEDs, other LED arrays, high voltage (HV) LEDs, and alternating current (AC) LEDs. While illustrated as being made of GaN, the LEDs also may be made of or include at least one of AlGaInP, GaAs, GaP, ZnO, or other materials known to those skilled in the art. These other materials may be doped to different conductivities.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and to modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of ion implantation comprising:
implanting ions into a portion of a structure through a coating on said structure, said structure defining a first surface and a plurality of second surfaces disposed adjacent to and at an angle relative to said first surface, wherein said ions penetrate said coating to a second depth in said second surfaces different from a first depth in said first surface, wherein said structure comprises an nGaN layer, a pGaN layer, and a quantum well.

2. The method of claim 1, wherein said first depth is zero and only said second surfaces are implanted.

3. The method of claim 1, wherein said ions are selected from the group consisting of nitrogen, hydrogen, oxygen, magnesium, carbon, iron, germanium, silicon, aluminum; fluorine, zinc, a noble gas, a p-type dopant, and an n-type dopant and wherein said coating is selected from the group consisting of silicon dioxide, silicon nitride, a metal, and a polymer.

4. The method of claim 1, wherein said coating defines a first thickness on said first surface and a second thickness on said second surfaces, wherein said second thickness is less than said first thickness.

5. The method of claim 1, wherein said ions are implanted at an angle relative to said first surface that is not perpendicular to said first surface.

6. The method of claim 1, wherein said implanting comprises a first implant step and a second implant step.

7. The method of claim 1, wherein said coating comprises a dopant and said implanting comprises knocking in said dopant into said structure.

8. The method of claim 1, wherein said first surface comprises a top surface of said structure and said plurality of second surfaces comprise sidewalls of said structure.

9. The method of claim 8, wherein said second depth is greater than said first depth.

10. A method of LED manufacturing comprising:
    depositing a coating on a structure that defines a first surface and a plurality of second surfaces that are at an angle relative to said first surface, wherein said structure comprises an nGaN layer, a pGaN layer, and a quantum well;
    performing a first implantation of ions through said coating; and
    forming implanted regions only within said second surfaces.

11. The method of claim 10, wherein said implanted regions are disposed within said quantum well and at least part of said nGaN layer and said pGaN layer.

12. The method of claim 10, wherein said ions are selected from the group consisting of nitrogen, hydrogen, oxygen, magnesium, carbon, iron, germanium, silicon, aluminum, fluorine, zinc, a noble gas, a p-type dopant, and an n-type dopant and wherein said coating is selected from the group consisting of silicon dioxide, silicon nitride, a metal, and a polymer.

13. The method of claim 10, wherein said coating defines a first thickness on said first surface and a second thickness on said second surfaces, wherein said second thickness is less than said first thickness.

14. The method of claim 10, wherein said first implantation is at an angle relative to said first surface that is not perpendicular to said first surface.

15. The method of claim 10, further comprising performing a second implantation of said ions through said coating.

16. The method of claim 10, wherein said coating comprises a dopant and said first implantation comprises knocking in said dopant into said structure.

17. The method of claim 10, further comprising removing said coating.

18. A method of LED manufacturing comprising:
    depositing a coating on a mesa defining a top surface and at least two sidewall surfaces, said mesa comprising an nGaN layer, a pGaN layer, and a quantum well, said coating defining a first thickness on said top surface and a second thickness on said sidewall surfaces, wherein said second thickness is less than said first thickness;
    implanting ions through said coating into said mesa in at least one ion implantation step, wherein said implanting is at an angle that is not perpendicular to said top surface;
    forming implanted regions only within said sidewall surfaces of said mesa; and
    removing said coating from said mesa.

19. The method of claim 18, wherein said implanted regions are disposed within said quantum well and at least part of said nGaN layer and said pGaN layer.

20. The method of claim 18, wherein said ions are selected from the group consisting of nitrogen, hydrogen, oxygen, magnesium, carbon, iron, germanium, silicon, aluminum, fluorine, zinc, a noble gas, a p-type dopant, and an n-type dopant and wherein said coating is selected from the group consisting of silicon dioxide, silicon nitride, a metal, and a polymer.

* * * * *